US012610601B2

(12) United States Patent
Zuniga et al.

(10) Patent No.: US 12,610,601 B2
(45) Date of Patent: Apr. 21, 2026

(54) FIELD PLATE BIASING OF HIGH ELECTRON MOBILITY TRANSISTOR

(71) Applicant: Infineon Technologies Canada Inc., Ottawa (CA)

(72) Inventors: Marco A. Zuniga, Berkeley, CA (US); Thomas William Macelwee, Nepean (CA); Rohan Samsi, Milpitas, CA (US); Lucas Andrew Milner, Sunnyvale, CA (US); Vineet Unni, Kanata (CA); Jayasimha S. Prasad, Upland, CA (US); Ashutosh Ravindra Joharapurkar, Bangalore (IN); Ramesh G. Karpur, Bangalore (IN)

(73) Assignee: Infineon Technologies Canada Inc., Ottawa (CA)

( * ) Notice: Subject to any disclaimer, the term of this patent is extended or adjusted under 35 U.S.C. 154(b) by 464 days.

(21) Appl. No.: 18/172,916

(22) Filed: Feb. 22, 2023

(65) Prior Publication Data

US 2024/0282827 A1     Aug. 22, 2024

(51) Int. Cl.
| | |
|---|---|
| *H01L 29/40* | (2006.01) |
| *H01L 29/20* | (2006.01) |
| *H01L 29/201* | (2006.01) |
| *H01L 29/778* | (2006.01) |
| *H10D 30/47* | (2025.01) |
| *H10D 62/85* | (2025.01) |

(Continued)

(52) U.S. Cl.
CPC ......... *H10D 64/111* (2025.01); *H10D 30/475* (2025.01); *H10D 62/8503* (2025.01); *H10D 62/852* (2025.01)

(58) Field of Classification Search
CPC ............... H10D 64/111; H10D 30/475; H10D 62/8503; H10D 62/852; H10D 30/4755
USPC .......................................................... 257/213
See application file for complete search history.

(56)                 References Cited

U.S. PATENT DOCUMENTS

| | | | |
|---|---|---|---|
| 9,306,014 B1 | 4/2016 | Kudymov | |
| 2008/0116492 A1 | 5/2008 | Wu | |

(Continued)

FOREIGN PATENT DOCUMENTS

| | | |
|---|---|---|
| CN | 103579332 | 2/2014 |
| CN | 104201201 | 12/2014 |

OTHER PUBLICATIONS

Written Opinion of the International Searching Authority for application No. PCT/IB2024/051736 mailed on Apr. 9, 2024.

*Primary Examiner* — Tong-Ho Kim
(74) *Attorney, Agent, or Firm* — WORKMAN NYDEGGER

(57)                 ABSTRACT

The biasing of one or more field plates of a high electron mobility transistor (a HEMT) with a non-zero voltage to thereby affect the electric field profile of the HEMT. The non-zero voltage may be a constant DC voltage, or perhaps may be a voltage that changes over time. The use of a non-zero voltage allows for greater ability to regulate and reduce the electric field occurring in the semiconductor channel region, especially at the field plate. Further, when the electric field occurring at the field plate is reduced, the overall size of the HEMT can also be reduced as compared to applying a zero voltage to the field plate. Alternatively, or in addition, applying a non-zero voltage to the field plate allows the voltage levels handled by the HEMT to be increased as compared to simply grounding the field plate.

18 Claims, 7 Drawing Sheets

(51) Int. Cl.
    *H10D 62/852*     (2025.01)
    *H10D 64/00*     (2025.01)

(56)         References Cited

U.S. PATENT DOCUMENTS

| | | | |
|---|---|---|---|
| 2012/0194276 A1 | 8/2012 | Fisher | |
| 2013/0127521 A1* | 5/2013 | Simin | H10D 64/112 |
| | | | 327/530 |
| 2013/0189817 A1* | 7/2013 | Peroni | H10D 64/411 |
| | | | 438/172 |
| 2021/0043724 A1* | 2/2021 | Wu | H10D 64/01 |

* cited by examiner

FIELD PLATE BIASING OF HIGH ELECTRON MOBILITY TRANSISTOR

BACKGROUND OF THE INVENTION

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current—hence the term "field-effect transistor".

One type of field-effect transistor is a "high electron mobility transistor" (often called an "HEMT"). High electron mobility transistors are used to control much higher voltages and currents. Higher voltage differences between the gate terminal and the drain terminal cause a large electric field peak to be produced around the semiconductor channel region on the side of the gate terminal more proximate to the drain terminal. To help reduce the magnitude of the electric field peak, high electron mobility transistors often also include one or more field plates (to which is applied a zero voltage) disposed above the semiconductor channel region between the gate terminal and the drain terminal. The field plates help to reduce electric field peaks that would have existed on the drain side of the gate terminal, as each field plate helps to step down the large voltage difference between the drain terminal and gate terminal.

The subject matter claimed herein is not limited to embodiments that solve any disadvantages or that operate only in environments such as those described above. Rather, this background is only provided to illustrate one exemplary technology area where some embodiments described herein may be practiced.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to the biasing of one or more field plates of a high electron mobility transistor (an HEMT) with a non-zero voltage to thereby affect the electric field profile of the HEMT. For example, the non-zero voltage may be a constant DC voltage, or perhaps may be a voltage that changes over time. The use of a non-zero voltage allows for greater ability to regulate and reduce the electric field occurring in the semiconductor channel region, especially at the field plate. Further, when the electric field occurring at the field plate is reduced, the overall size of the HEMT can also be reduced as compared to applying a zero voltage to the field plate. Alternatively, or in addition, applying a non-zero voltage to the field plate allows the voltage levels handled by the HEMT 101 to be increased as compared to applying a zero voltage to the field plate.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the systems and methods described herein can be obtained, a more particular description of the embodiments briefly described above will be rendered by reference to specific embodiments thereof which are illustrated in the appended drawings. Understanding that these drawings depict only typical embodiments of the systems and methods described herein, and are not therefore to be considered to be limiting of their scope, certain systems and methods will be described and explained with additional specificity and detail through the use of the accompanying drawings in which.

DETAILED DESCRIPTION OF THE INVENTION

Embodiments described herein relate to a type of field-effect transistor. Field-effect transistors function as electronic switches that can be turned on or off by applying a voltage to a gate terminal. A semiconductor channel region is disposed between a source terminal and a drain terminal. The gate terminal is disposed over the semiconductor channel region between the source terminal and the drain terminal. When the field-effect transistor is on, current flows through the semiconductor channel region between the source terminal and the drain terminal. When the field-effect transistor is off, lesser or no current flows through the semiconductor channel region between the source terminal and the drain terminal. Voltage applied to the gate terminal generates a field that affects whether the semiconductor channel region conducts current—hence the term "field-effect transistor". In an "enhancement mode" field-effect transistor, the transistor is on when a positive voltage is applied to the gate terminal, and off when the gate terminal is grounded. On the other hand, in a "depletion mode" field-effect transistor, the transistor is on when the gate terminal is grounded, and off when a negative voltage is applied to the gate terminal.

One type of field-effect transistor is a "high electron mobility transistor" (often called an "HEMT"). The term "high electron mobility transistor" is a term that is known in the art. Hereafter, as in the art, a "high electron mobility transistor" will also be referred to as an HEMT. Further, while the principles described herein are beneficial when applied to both "enhancement mode" HEMTs (also called "eHEMT") and "depletion mode" HEMTs (also called "dHEMT"), the embodiments described herein and illustrated in the figures will focus on enhancement mode HEMTs.

HEMTs are used to control much higher voltages and currents. When an HEMT is turned off (i.e., when zero voltage is applied to the gate terminal), high voltage differences between the gate terminal and the drain terminal cause a large electric field to be produced in the semiconductor channel region particularly in the part of the semiconductor channel region that is closest to the side of the gate terminal that is more proximate to the drain terminal. HEMTs often also include one or more grounded field plates disposed above the semiconductor channel region between the gate terminal and the drain terminal. A field plate is, for example, a layer of deposited conductive material, such as metal. These field plates reduce the magnitude of the electric field occurring in that part of the semiconductor channel region, and reduce the maximum electric field in the overall semiconductor channel region.

Figure 1:
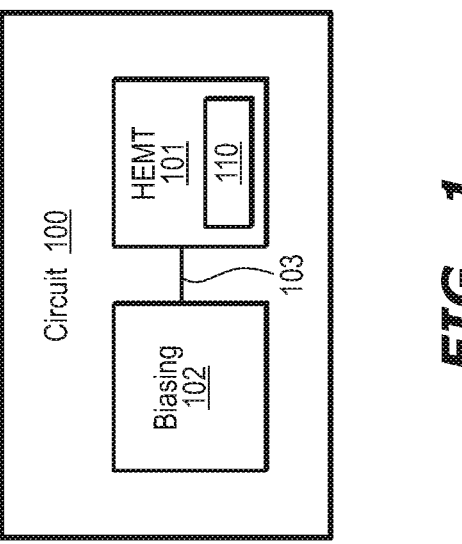
FIG. 1 illustrates a circuit in which the principles described herein may be practiced, and which includes a high electron mobility transistor (HEMT) and a biasing circuit that applies a DC or dynamic biasing voltage to field plate(s) of the HEMT.

An embodiment will be described with respect to FIG. 1. FIG. 1 illustrates a circuit 100 in which the principles described herein may be practiced. The circuit 100 includes an HEMT 101 and a biasing circuit 102 that are electronically connected via a connection 103. Broadly speaking, an HEMT is a type of field-effect transistor. The HEMT 101 includes a field plate 110 that allows the electric fields occurring in the semiconductor channel region to be reduced. Unlike conventional HEMT circuits, the biasing circuit 102 applies (via the connection 103) a non-zero voltage to the field plate 110. As an example, the biasing circuit 102 may be a drive circuit.

For example, the non-zero voltage may be a constant DC voltage, or perhaps may be a voltage that changes over time. The use of a non-zero voltage allows for greater ability to regulate and reduce the electric field occurring in the semiconductor channel region, especially at the field plate 110. Further, when the electric field occurring at the field plate 110 is reduced, the overall size of the HEMT 101 can also be reduced as compared to applying a zero voltage to the field plate 110. Alternatively, or in addition, applying a non-zero voltage to the field plate 110 allows the voltage levels handled by the HEMT 101 to be increased as compared to applying a zero voltage the field plate 110. In one embodiment, the absolute value of the non-zero voltage is at least 0.5 volts. In one embodiment, the absolute value of the non-zero voltage is at least 0.2 volts. In one embodiment, the absolute value of the non-zero voltage is at least 0.1 volts.

In order to fully understand why these advantages can be obtained by applying a non-zero voltage to the field plate 110, this discussion will now revert to a discussion of how an HEMT might operate without a field plate. This discussion is for purposes of explaining why even conventional HEMTs have grounded field plates with zero volts applied. Accordingly, the operation of an HEMT without a field plate will be described with respect to FIGS. 2A and 2B. Then, the operation of an HEMT with a field plate at zero volts will be described with respect to FIGS. 3A and 3B.

Figures 2A, 2B:
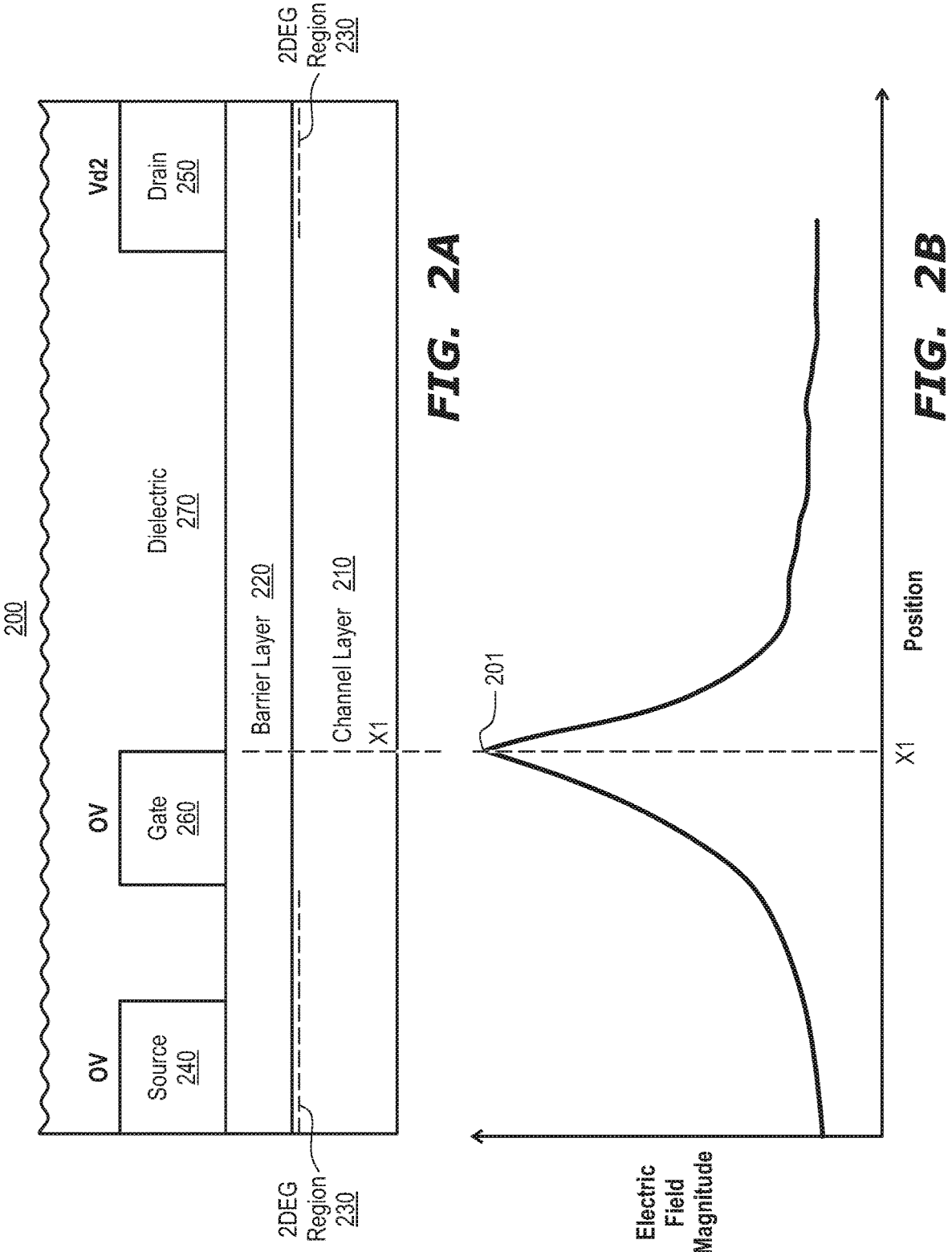
FIG. 2A illustrates a cross-sectional view of an HEMT without a field plate that will be used to explain a general structure and operation of an HEMT.
FIG. 2B illustrates an electric field profile diagram of the HEMT of FIG. 2A.

FIG. 2A illustrates a cross-sectional view of an HEMT 200 without a field plate that will be used to explain a general structure and operation of an HEMT. HEMTs include a semiconductor channel region that is comprised of a channel layer and a barrier layer formed thereon. HEMTs are formed by having a heterojunction connection in between the barrier layer and the channel layer. A heterojunction is an interface between two layers or regions of dissimilar semiconductor materials. For example, in FIG. 2A, the HEMT 200 includes a semiconductor channel region comprised of a channel layer 210 and a barrier layer 220 formed thereon.

The semiconductor materials that make up the barrier layer and the channel layer have unequal bandgaps. The unequal bandgaps between the barrier layer and the channel layer cause electrons to be confined to a thin layer at the top of the channel layer, forming a region known as "two-dimensional electron gas", herein referred to as a "2DEG" region. For instance, in FIG. 2A, unequal bandgaps of the semiconductor materials that make up the channel layer 210 and the barrier layer 220 cause a 2DEG region 230 to be formed at the top of the channel layer 210 (except where the zero voltage at the gate terminal 260 depletes the 2DEG region). The principles described herein are not limited to the type of material that the barrier layer 220 and the channel layer 210 are composed of. For example, if the channel layer is composed of GaN, and the barrier layer is composed of AlGaN, the bandgap differences would be sufficient to generate a 2DEG region 230.

The 2DEG region has a high density of mobile electrons that move easily in a two-dimensional plane parallel to the heterojunction between the barrier layer and the channel layer, but that are confined within a small range in the height direction. Because "gas" is a highly mobile state of matter, the term "electron gas" is used with respect to the 2DEG region to emphasize that the electrons therein are highly mobile. This means that the electrons can move without significant resistance. Thus, the 2DEG region can operate with very low resistance, though this can change depending on whether the HEMT is on or off. Accordingly, the 2DEG region can convey high currents without significant heat generation. For at least these reasons, HEMTs are useful in high voltage and high current circuits.

The HEMT 200 includes a source terminal 240 and a drain terminal 250 disposed on opposite sides (in the width direction) over the top surface of the barrier layer 220. More specifically, in FIG. 2A, the source terminal 240 is disposed over the left of the top surface of the barrier layer 220, and the drain terminal 250 is disposed over the right of the top surface of the barrier layer 220. A gate terminal 260 is disposed over the barrier layer 220 between the source terminal 240 and the drain terminal 250. Though the source terminal 240 and the drain terminal 250 are illustrated on top of the barrier layer, some HEMTs have the source terminal and the drain terminal extend through the barrier layer 220 to the level of the 2DEG region.

A portion of the 2DEG region 230 below the gate terminal 260 is affected by the voltage applied at the gate terminal 260. For example, when the HEMT 200 is on, the 2DEG region 230 is fully formed below the gate terminal 260, thus allowing current to freely flow in the channel layer 210 below the gate terminal 260. However, when the HEMT 200 is off (as in the case of FIGS. 2A and 2B), the 2DEG region 230 no longer exists (or is at least mostly depleted) underneath the gate terminal 260. This prevents or substantially inhibits current from flowing in the 2DEG region 230 between the source terminal 240 and the drain terminal 250. As an example, a high voltage on the gate terminal 260 has a tendency to attract electrons towards the heterojunction thus creating or thickening the 2DEG region 230. On the other hand, a very low or zero voltage on the gate terminal 260 has a tendency to repel electrons away from the heterojunction thus thinning or depleting the 2DEG region 230.

Further, a dielectric material 270 exists in the regions between the source terminal 240, gate terminal 260, and drain terminal 250 in the width direction, and above the barrier layer 220 in the height direction. The dielectric material 270 functions as an insulator and assists in the overall structural stability of the HEMT 200.

The HEMT 200 of FIG. 2A functions as an enhancement mode HEMT that is turned off when zero volts is applied to the gate terminal 260. Thus, the source terminal 240 and the gate terminal 260 have zero volts applied thereto, and a positive voltage $V_{d2}$ is applied to the drain terminal 250. While in the off-state, an electric field maximum 201 (also referred to as a "peak") occurs at position X1 in the channel layer 210 near the drain side of the gate terminal 260. FIG. 2B is an electric field profile diagram corresponding to the HEMT 200 of FIG. 2A. Horizontal positions are aligned in FIGS. 2A and 2B such that the electric field occurring at each horizontal position in FIG. 2A is represented by the electric field charted immediately below in FIG. 2B. In order to explain why large electric fields are produced, a brief explanation of electric fields will now be described.

The magnitude of an electric field between two points of different voltages is proportional to the magnitude of that voltage difference and inversely proportional to the distance between the two points. Thus, in the channel layer, as charge carriers approach within the 2DEG region 230 to the gate terminal 260 from the right, the distance rapidly declines, and thus the electric field increases. At some point, the voltage in the channel layer begins to drop due to the high electric field. When the voltage decrease balances with the decreased distance (which occurs at position X1) the electric field is at equilibrium at its peak. Moving further to the left, the voltage drop in the channel layer becomes dominant, and the electric field thus declines. The electric field peak 201 is high because substantially all of the voltage $V_{d2}$ applied at the drain terminal is still present when approaching position X1.

Problems can occur in HEMTs if the electric fields are too large. For example, in the HEMT 200 of FIG. 2A, the large electric field at position X1 would cause the HEMT 200 to quickly degrade and be almost immediately inoperable. This is because large electric fields at the drain side of the gate terminal cause "gate current leakage", in which some electrons pass through the barrier layer under the gate terminal, and a small current is induced between the gate terminal and the drain terminal. This causes HEMT degradation. To prevent this, field plates are conventionally used with zero volts applied to the field plates.

Figures 3A, 3B:
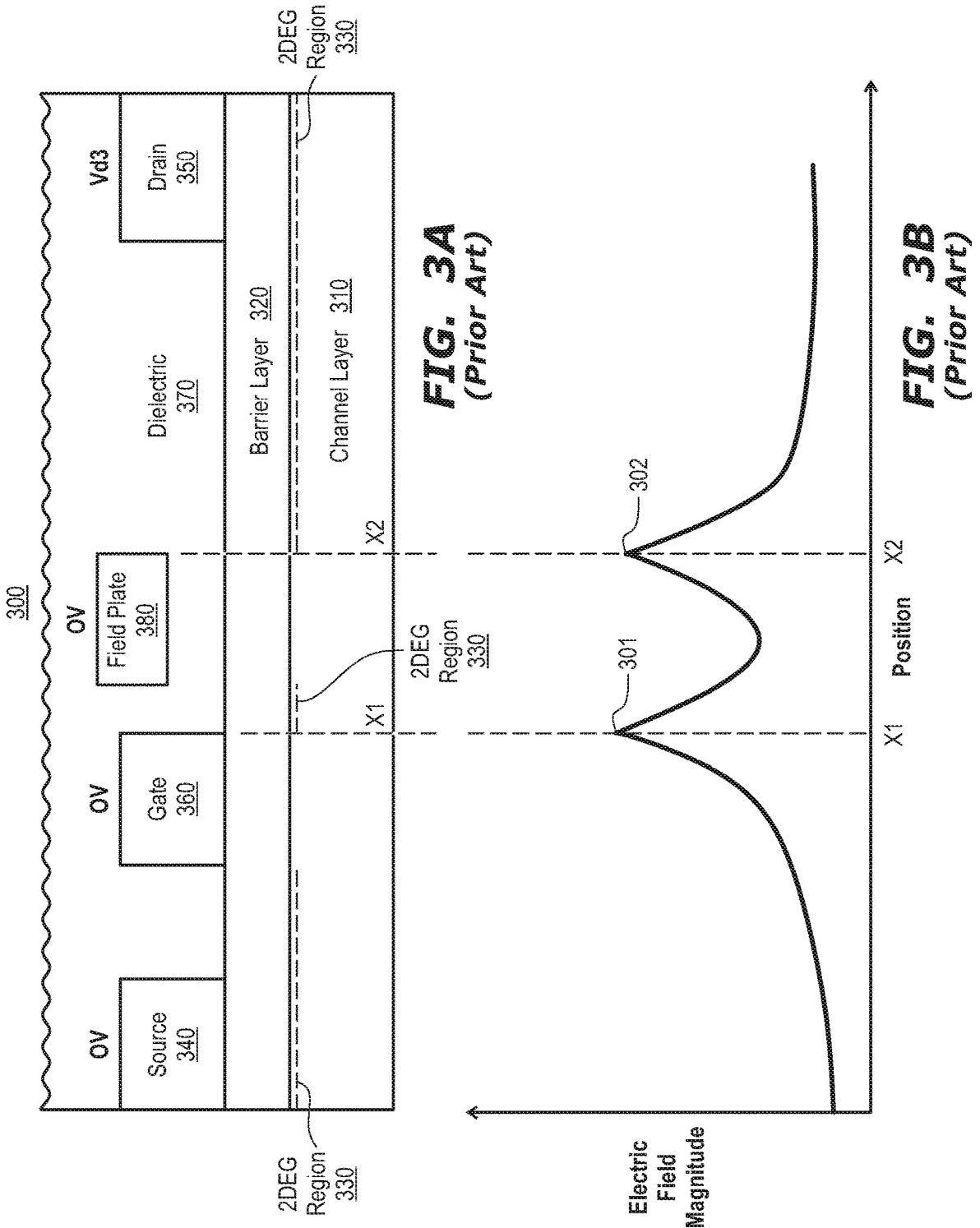
FIG. 3A illustrates a cross-sectional view of an HEMT with a grounded field plate that is used to explain the function of a field plate in HEMTs.
FIG. 3B illustrates an electric field profile diagram of the HEMT of FIG. 3A.

To further discuss the conventional structure and benefits of including a zero voltage field plate in an HEMT, FIG. 3A illustrates a cross-sectional view of an HEMT 300 with a zero voltage field plate 380. FIG. 3B is an electric field profile diagram corresponding to the HEMT 300 of FIG. 3A. Horizontal positions are aligned in FIGS. 3A and 3B such that the electric field occurring at each horizontal position in FIG. 3A is represented by the electric field charted immediately below in FIG. 3B.

The channel layer 310, the barrier layer 320, the source terminal 340, the drain terminal 350, the gate terminal 360 and the dielectric material 370 may have the same structure as described above in reference to FIG. 2A with respect to the corresponding channel layer 210, barrier layer 220, source terminal 240, drain terminal 250, gate terminal 260, and dielectric material 270. Again, the unequal bandgaps of the semiconductor materials that make up the channel layer 310 and the barrier layer 320 cause a 2DEG region 330 to be formed at the top of the channel layer 310 (except when off underneath the gate terminal 360 and also except underneath the zero voltage field plate 380).

However, unlike the HEMT 200 of FIG. 2A, the HEMT 300 of FIG. 3A includes a field plate 380. The HEMT 300 functions as an enhancement mode HEMT that is turned off since a zero voltage is applied to the source terminal 340 and the gate terminal 360. The field plate 380 also has a zero voltage applied, and a positive voltage $V_{d3}$ is applied to the drain terminal 350.

In order to reduce electric field peaks, especially at the drain side of the gate terminal, conventional HEMTs usually include one or more zero voltage field plates disposed between the gate terminal and the drain terminal, but displaced in a height direction further from the semiconductor channel region. For example, the HEMT 300 of FIG. 3A includes the zero voltage field plate 380 disposed between the gate terminal 360 and the drain terminal 350 in the width direction, but displaced in the height direction away from the semiconductor channel region. The field plate 380 is further from the semiconductor channel region in the height direction than the gate terminal 360.

The aim of the field plate 380 is to reduce the voltage present in the channel layer 310 at position X1, thereby reducing the magnitude of the electric field peak 301 as compared to the electric field peak 201. This voltage is reduced because the field plate 380 induces another electric field peak 302 at position X2 that causes the voltage in the channel layer to be reduced moving leftward through position X2, thus lowering the voltage present at the position X1.

Figures 4A, 4B:
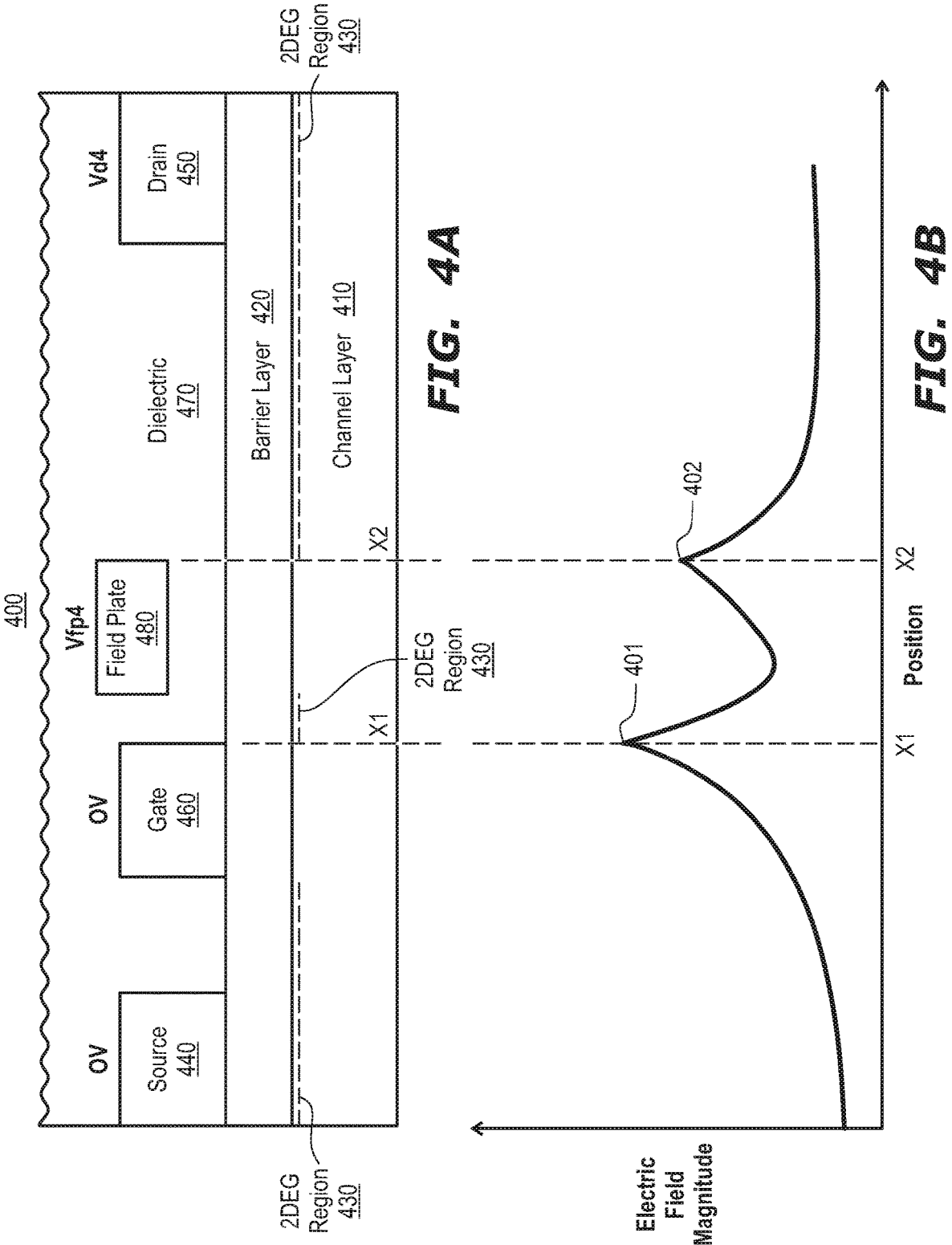
FIG. 4A illustrates a cross-sectional view of an HEMT with a biased field plate, in accordance with the principles described herein.
FIG. 4B illustrates an electric field profile diagram of the HEMT of FIG. 4A.

FIG. 4A illustrates a cross-sectional view of HEMT 400 with a biased field plate 480, in accordance with one aspect described herein. As the term is used herein, a "biased" field plate is a field plate that has a non-zero (e.g., positive or negative) voltage applied thereto. FIG. 4B is an electric field profile diagram corresponding to the HEMT 400 of FIG. 4A. Horizontal positions are aligned in FIGS. 4A and 4B such that the electric field occurring at each horizontal position in FIG. 4A is represented by the electric field charted immediately below in FIG. 4B.

For purposes of the embodiment of FIG. 4A (but not limiting the broader aspects described herein), suppose that the channel layer 410, the barrier layer 420, the source terminal 440, the drain terminal 450, the gate terminal 460, the dielectric material 470 and the field plate 480 have the same structure as described above in reference to FIG. 3A with respect to the corresponding channel layer 310, barrier layer 320, source terminal 340, drain terminal 350, gate terminal 360, dielectric material 370 and field plate 380. That said, the application of the principles described herein allow for greater flexibility in how HEMTs are structured and sized.

Again, the unequal bandgaps of the semiconductor materials that make up the channel layer 410 and the barrier layer 420 cause a 2DEG region 430 to be formed at the top of the channel layer 420 (except when off underneath the gate terminal 460 and underneath the biased voltage field plate 480). However, unlike the zero voltage field plate 380 of the HEMT 300 of FIG. 3A, the field plate 480 of the HEMT 400 of FIG. 4A has a non-zero bias voltage applied thereto. In FIG. 4A, suppose that the non-zero bias voltage is a positive voltage, although the principles described herein are not limited to the non-zero bias voltage being positive. The HEMT 400 functions as an enhancement mode HEMT that is turned off since ground is applied to the source terminal 440 and the gate terminal 460. A positive voltage $V_{fp4}$ is applied to the biased field plate 480, and a positive voltage $V_{d4}$ is applied to the drain terminal 450. The positive voltage $V_{fp4}$ may be, for example, a DC voltage, and may be applied by, for example, a biasing circuit such as the biasing circuit 102 of FIG. 1.

In order to reduce electric field peaks, especially at the drain side of the field plate, the embodiment of FIG. 4A involves applying a positive bias voltage to the field plate. For example, the HEMT 400 of FIG. 4A has a positive voltage $V_{fp4}$ applied to the field plate 480. Recall that the magnitude of an electric field between two points of different voltage is proportional to the magnitude of that voltage difference and inversely proportional to the distance between the two points. Because a positive bias voltage is applied to the field plate in FIG. 4A, the voltage difference between the field plate and the channel layer is reduced compared to what the voltage difference would be with a grounded field plate. Accordingly, with this reduced voltage difference, the electric fields proximate the field plate 480 (including the peak 402 at position X2) are reduced when applying a positive bias voltage to the field plate 480 as compared to having a zero voltage field plate.

The inventors have discovered that the operation of a HEMT is impacted by the magnitude of the electric field peak and the proximity of that peak to the drain terminal. For example, larger electric field peaks that are closer to the drain terminal can have more adverse impact on the performance of the HEMT. Thus, by reducing the electric field peak 402 of HEMT 400 at position X2, the performance of the HEMT 400 has been improved even if other more distant electric field peaks increase slightly. This provides an additional safety factor in the performance of the HEMT 400. For example, the HEMT 400 may be designed to bring the drain terminal 450 closer to the field plate while still staying within adequate performance margins. Thus, more HEMTs may be manufactured on a same die or wafer. Similarly, the operating voltage (i.e., the drain voltage) of the HEMT 400 may be increased while still staying within the performance margins.

The above description focuses on the voltage $V_{fp4}$ being a fixed positive voltage applied in order to reduce the magnitude of the electric field peak 402. However, the positive voltage $V_{fp4}$ may also be negative, or may also be controlled to be dynamic so as to change the magnitude of the electric field peak 402. Thus, the electric field peak 402 may be fine-tuned as appropriate. Stated more broadly, the electric field profile of FIG. 4B may be adjusted as appropriate. Further, changing the voltage $V_{fp4}$ applied to the field plate 480 can have a residual effect on the magnitude of the electric field peak 401 at position X1. Thus, the electric field peak 401 may also be fine-tuned as appropriate. Furthermore, the electric field peak 402, as well as the electric field peak 401, may vary in magnitude depending on whether the HEMT 400 is on or off, is transitioning from on to off, or is transitioning from off to on. To account for this, the positive voltage $V_{fp4}$ may be adjusted depending on the operation state of the HEMT 400.

Figure 5:
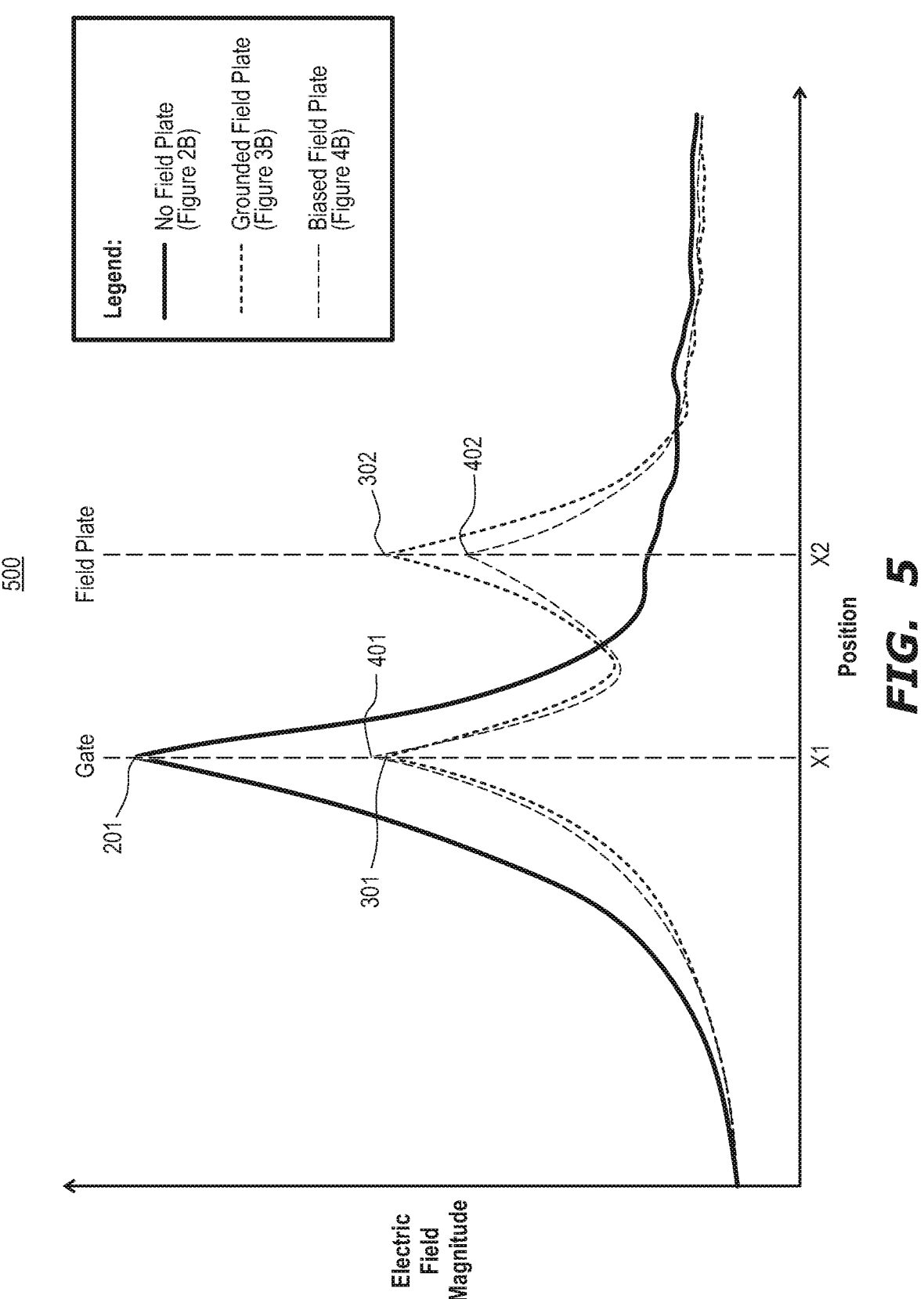
FIG. 5 is an electric field diagram in which the electric field profiles of all of FIGS. 2B, 3B and 4B are illustrated in superimposed form.

FIG. 5 is an electric field diagram 500 in which the electric field profiles of all of FIGS. 2B, 3B and 4B are illustrated in superimposed form. The electric field profile of the HEMT 200 of FIG. 2A is represented by a dotted line, and shows a high electric field peak 201 at position X1. The electric field profile of the HEMT 300 of FIG. 3A is represented by a dashed line, and shows an electric field peak 301 at position X1, and another electric field peak 302 at position X2. Notice that the magnitude of the electric field peak 301 of the HEMT 300 at position X1 is substantially smaller than the electric field peak 201 of the HEMT 200 at position X1, demonstrating the effectiveness of having electric field plates.

The electric field profile of the HEMT 400 of FIG. 4A is represented by a solid line, and shows an electric field peak 401 at position X1, and another electric field peak 402 at position X2. Notice that the magnitude of the electric field peak 402 of the HEMT 400 at position X2 is substantially smaller than the electric field peak 302 of the HEMT 300 at position X2. This demonstrates that adjusting the voltage applied to the field plate can have the effect of reducing the electric field peak that is closest to the drain terminal. Thus, adjusting the voltage applied to the field plate can improve the safety margin of the HEMT, which allows for the design of the HEMT to be potentially smaller, and/or operate at higher voltages.

As previously mentioned, HEMTs may include more than one zero voltage field plate. Further, the benefits described herein of applying a non-zero bias voltage to a single field plate can be further beneficial when applying non-zero voltages to multiple field plates, or even when applying non-zero voltages to some field plates while others have a zero voltage applied. As an example, FIG. 6 illustrates a cross-sectional view of an HEMT 600 with three field plates.

The HEMT 600 includes a semiconductor channel region that includes a channel layer 610 that may be, for example, a GaN layer that is epitaxially deposited on a substrate (e.g., silicon). The semiconductor channel region also includes a barrier layer 620 that may be, for example, AlGaN that is epitaxially deposited on the channel layer 610. Further, the HEMT 600 of FIG. 6 includes a source terminal 640 and a drain terminal 650 disposed on opposites sides (in the width direction) over the top surface of the barrier layer 620. More specifically, in FIG. 6, the source terminal 640 is disposed over the left of the top surface of the barrier layer 620, and the drain terminal 650 is disposed over the right of the top surface of the barrier layer 620. A gate terminal 660 is disposed over the barrier layer 620 between the source terminal 640 and the drain terminal 650. Further, a dielectric material (labelled "SiO2") exists in the regions between the source terminal, gate terminal, and drain terminal in the width direction, and above the barrier layer in the height direction. The dielectric material functions as an insulator and assists in the overall structural stability of the HEMT of FIG. 6.

Figure 6:
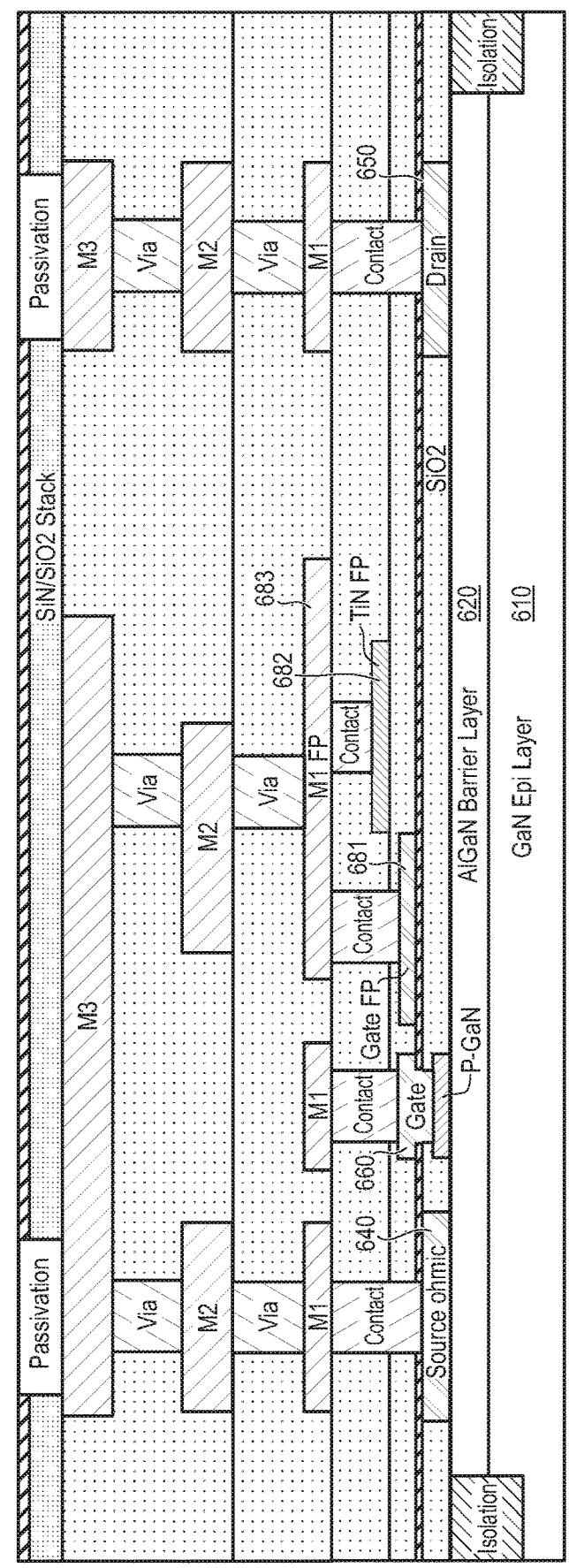
FIG. 6 illustrates a cross-sectional view of an HEMT with three field plates.

The HEMT 600 of FIG. 6 includes the three field plates 681, 682 and 683 (which may also be referred to as a "first field plate" 681, "second field plate" 682, and "third field plate" 683, respectively). Although the principles described herein are not limited to the distance between the field plates and the barrier layer, in the specific example of the HEMT 600, the field plates that are closer to the gate terminal are closer to the barrier layer in the height direction, and field plates that are closer to the drain terminal are further from the barrier layer in the height direction. Note that, while FIG. 6 illustrates each of the first field plate, second field plate, and third field plate being connected by conductive materials (labelled "contact, M1, M2, M3, via, etc."), some embodiments involve having a disconnected first field plate, second field plate, and third field plate, such that each field plate can have differing voltages applied thereto.

For example, in FIG. 6, it is possible to apply a first voltage to the first field plate, a second voltage to the second field plate, and a third voltage to the third field plate, where each of the first voltage, second voltage and third voltage are different from each other. In another example, any combination of the first voltage, second voltage, or third voltage could be the equal. Alternatively, one or more of the first field plate, second field plate, or third field plate could be zero voltage, while others of the first field plate, second field plate, or third field plate could have a non-zero voltage applied thereto.

Further, in some embodiments, one or more of the first field plate, second field plate, or third field plate could share a same height distance away from the barrier layer, while having different voltages applied thereto. For example, the first field plate and second field plate could have the same height direction away from the barrier layer, while the first field plate could have a first voltage applied thereto, whereas the second field plate could be grounded, or have a second voltage applied thereto. In each of these scenarios, it is possible for any of the first field plate, second field plate, or third field plate to be grounded or have a voltage applied thereto by being shorted to the source terminal or the gate terminal. This allows the semiconductor fabrication to be simplified since field plates may perhaps be deposited and formed using the same processing steps as the gate terminal and/or other field plates.

Figure 7:
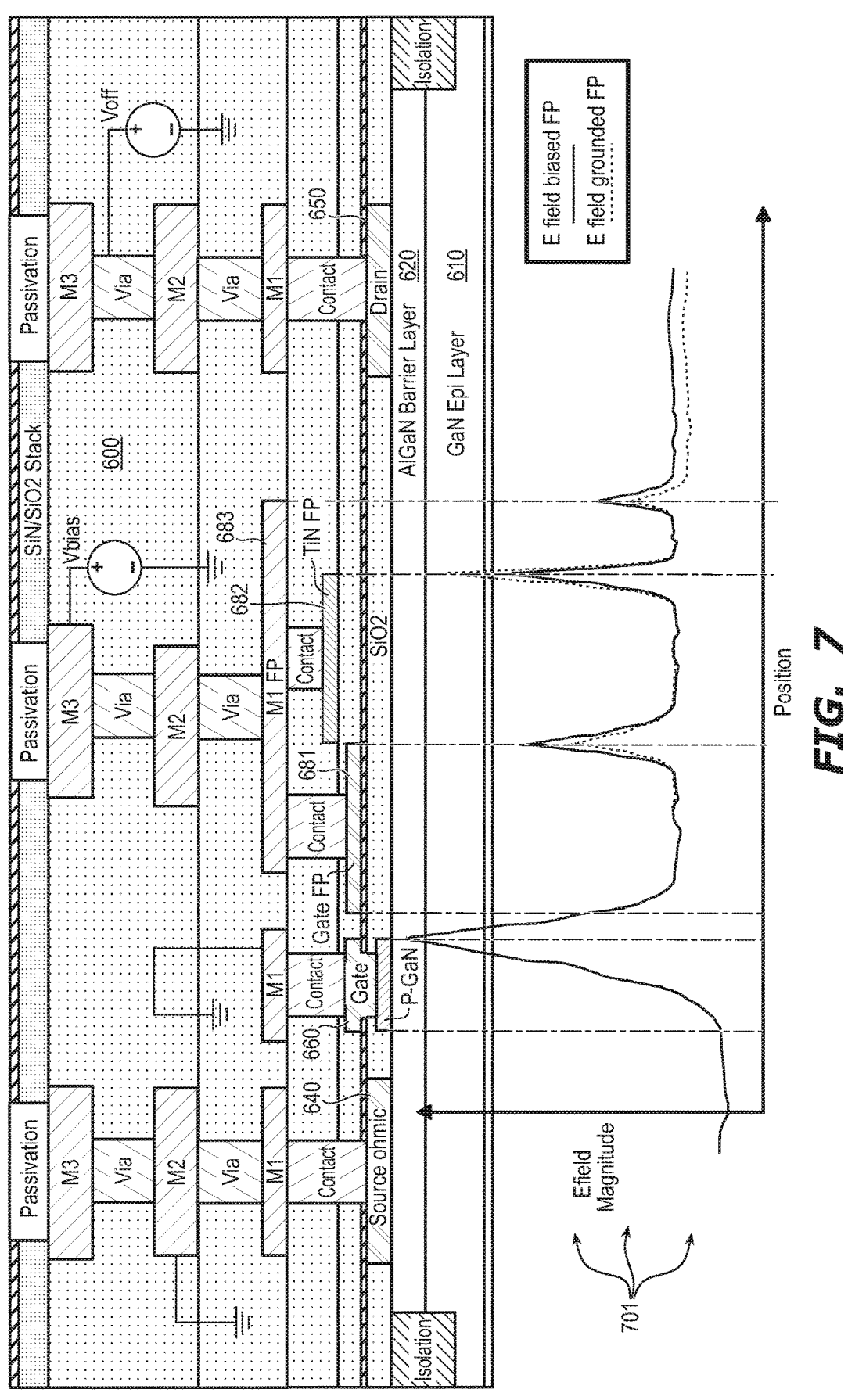
FIG. 7 illustrates the HEMT of FIG. 6 along with applied voltages and resulting electric field profiles.

FIG. 7 illustrates the HEMT 600 of FIG. 6 with specific voltages applied to the source terminal 640, drain terminal 650, gate terminal 660 and each of the field plates 681, 682 and 683. For example, the source terminal 640 and gate terminal 660 are each grounded. Furthermore, a voltage Vbias is applied to the first field plate 681, the second field plate 682, and the third field plate 683. The biasing voltage Vbias may be applied by, for example, a biasing circuit such as the biasing circuit 102 of FIG. 1. The electric field profile diagram 701 illustrates the corresponding electric field profile in solid lined form. For comparison, the electric field profile that would occur had the fields plates 681, 682 and 683 been grounded is illustrated in dotted-lined formed in the electric field profile diagram 701.

As can be seen from the electric field profile diagram, by applying the Vbias voltage to the field plates, the electric field peak existing at the drain side of the second field plate can be significantly reduced compared to simply grounded the field plates. Recall that the operation of an HEMT is impacted by the magnitude of the electric field peak and the proximity of that peak to the drain terminal. For example, larger electric field peaks that are closer to the drain terminal can have a more adverse impact on the performance of an HEMT. Stated more broadly, by manipulating the biasing voltage that is applied to any one or more of the field plates, the electric field profile may be manipulated.

By reducing the size of the electric field peak at the drain side of the second field plate, an additionally safety factor in the performance of the HEMT of FIG. 7 is provided. Further, the HEMT of FIG. 7 may be designed to bring the drain terminal closer to the field plates while still staying within adequate performance margins. Thus, more example HEMTs of FIG. 7 may be manufactured on a same die or wafer. Similarly, the operating voltage (i.e., the drain voltage) of the HEMT of FIG. 7 may be increased while still staying within the performance margins.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A circuit comprising:
a high-electron-mobility transistor comprising a gate disposed over a semiconductor channel region between a source and a drain, and a field plate disposed over the semiconductor channel region between the gate and the drain; and
a biasing circuit configured to apply a dynamically changing voltage to the field plate such that the dynamically changing voltage changes depending on at least an operational state of the high-electron-mobility transistor.

2. The circuit in accordance with claim 1, the field plate being a first field plate, the dynamically changing voltage being a first dynamically changing voltage, the high-electron-mobility transistor further comprising a second field plate disposed over the semiconductor channel region between the gate and the drain, the circuit configured to apply a second dynamically changing voltage to the second field plate.

3. The circuit in accordance with claim 2, the second field plate being short circuited to the source.

4. The circuit in accordance with claim 2, a first distance between the first field plate and the semiconductor channel region being a same distance as a second distance between the second field plate and the semiconductor channel region.

5. The circuit in accordance with claim 4, the high-electron-mobility transistor further comprising a third field plate disposed over the semiconductor channel region between the gate and the drain, a third distance between the third field plate and the semiconductor channel region being different than the first distance and the second distance.

6. The circuit in accordance with claim 5, the circuit configured to apply a third dynamically changing voltage to the third field plate.

7. The circuit in accordance with claim 2, the high-electron-mobility transistor further comprising a third field plate disposed over the semiconductor channel region between the gate and the drain, the circuit configured to apply a third dynamically changing voltage to the third field plate.

8. The circuit in accordance with claim 1, the field plate short-circuited to the gate, the biasing circuit being a drive circuit for driving the gate.

9. The circuit in accordance with claim 1, the biasing circuit configured such that the dynamically changing voltage changes depending on whether the high-electron-mobility transistor is on or off.

10. The circuit in accordance with claim 1, the biasing circuit configured such that the dynamically changing voltage changes depending on whether the high-electron-mobility is transitioning from on to off or off to on.

11. The circuit in accordance with claim 1, the biasing circuit configured such that the dynamically changing voltage changes depending on whether the high-electron-mobility transistor is on or off, and whether the high-electron-mobility is transitioning from on to off or off to on.

12. The circuit in accordance with claim 1, the semiconductor channel region comprising an AlGaN barrier layer over a GaN channel layer.

13. A method for biasing a field plate of a high-electron-mobility transistor, the high-electron-mobility transistor comprising a gate disposed over a semiconductor channel region between a source and a drain, and a field plate disposed over the semiconductor channel region between the gate and the drain, the method comprising:

operating the high-electron mobility transistor such that the high-electron mobility transistor passes through a plurality of operational states; and applying a dynamically changing voltage to the field plate such that the dynamically changing voltage changes depending on which of the plurality of operational states the high-electron mobility transistor is currently in.

14. The circuit in accordance with claim 13, the plurality of operational states including a transistor on state and a transistor off state.

15. The circuit in accordance with claim 14, the plurality of operational states also include a transistor transitioning off-to-on state and a transistor transitioning on-to-off state.

16. The circuit in accordance with claim 13, the plurality of operational states also include a transistor transitioning off-to-on state and a transistor transitioning on-to-off state.

17. The method in accordance with claim 13, the field plate being a first field plate, the dynamically changing voltage being a first dynamically changing voltage, the method further for biasing a second field plate of the high-electron mobility transistor wherein the second field plate is also disposed over the semiconductor channel region between the gate and the drain, the method further comprising:

applying a second dynamically changing voltage to the second field such that the second dynamically changing voltage changes depending on which of the plurality of operational states the electron mobility transistor is current in.

18. The method in accordance with claim 17, the method further for biasing a third field plate of the high-electron mobility transistor wherein the third field plate is also disposed over the semiconductor channel region between the gate and the drain, the method further comprising:

applying a third dynamically changing voltage to the third field such that the third dynamically changing voltage changes depending on which of the plurality of operational states the electron mobility transistor is current in.

* * * * *